United States Patent [19]
Knee et al.

[11] Patent Number: 5,337,254
[45] Date of Patent: Aug. 9, 1994

[54] PROGRAMMABLE INTEGRATED CIRCUIT OUTPUT PAD

[75] Inventors: Derek L. Knee, Sunnyvale; Wang K. Li, San Jose, both of Calif.; Thomas O. Wheless, Jr., Eagle, Id.

[73] Assignee: Hewlett-Packard Company, Palo Alto, Calif.

[21] Appl. No.: 807,971

[22] Filed: Dec. 16, 1991

[51] Int. Cl.$^5$ .............................................. H03L 7/00
[52] U.S. Cl. ...................... 364/489; 364/490; 307/296.1
[58] Field of Search ............... 364/489, 482, 483, 490; 307/296.4, 296.6, 296.1; 371/15.1, 28; 328/59

[56] References Cited

U.S. PATENT DOCUMENTS

| | | | |
|---|---|---|---|
| 4,383,216 | 5/1983 | Dorler et al. | 323/282 |
| 4,473,762 | 9/1984 | Iwahashi et al. | 307/594 |
| 4,494,021 | 1/1985 | Bell et al. | 307/591 |
| 4,623,805 | 11/1986 | Flora et al. | 307/602 |
| 4,641,048 | 2/1987 | Pollock | 307/591 |
| 4,684,897 | 8/1987 | Richards et al. | 328/162 |
| 4,691,124 | 9/1987 | Ledzius et al. | 307/303 |
| 4,815,113 | 3/1989 | Ludwig et al. | 377/39 |
| 4,818,901 | 4/1989 | Young et al. | 307/451 |
| 4,939,389 | 7/1990 | Cox et al. | 371/15.1 |
| 5,086,238 | 2/1992 | Watanabe et al. | 307/296.6 |
| 5,198,758 | 3/1993 | Iknaian et al. | 324/158 R |
| 5,198,759 | 3/1993 | Ohnosorge | 324/158 R |
| 5,272,390 | 12/1993 | Watson, Jr. et al. | 307/296.1 |

OTHER PUBLICATIONS

"Designers Seek Reduction of Electrical Noise", N. Kumar, ASiC Technology & News, Jul. 1990.
"VLSI Performance Compensation for Off-Chip Drivers and Clock Generation", D. Cox et al., IEEE 1989 Custom Integrated Circuits Conference.
"A 50-ns 16-Mb DRAM with a 10-ns Data Rate and On-Chip ECC", H. Kalter et al., IEEE Journal of Solid State Circuits, vol. 25, No. 5, Oct. 1990.
"A 300k-Circuit ASIC Logic Family", J. Petrovick, et al., 1990 IEEE International Solid-State Circuits Conference Feb. 15, 1990.
"Process-Independent Delay Driver", IBM Tech. Disclosure Bulletin, vol. 23, No. 9, Feb. 1981.
"Delay and Power Tolerance Regulator for FET Logic", K. King et al., IBM Tech. Discl. Bulletin, vol. 23, No. 4, Sep. 1980.

*Primary Examiner*—Ellis B. Ramirez

[57] ABSTRACT

A system is described that includes an integrated circuit chip having output paths connected to a network whose electrical of capacitance characteristics can vary. The system includes a circuit for adjusting output drive applied to a pad on the chip. The circuit includes a PVT monitor for providing an output that is related to process, voltage and temperature parameter variations on the chip. A processor determines network configuration information and enables the network's electrical or capacitance characteristics to be determined. The processor is responsive to an output from the PVT monitor and the network's determined electrical characteristics to provide control outputs indicative of a required output drive current level. A drive current circuit includes alterable circuitry and is responsive to the processor's control output to provide the required output drive levels to the pad.

15 Claims, 3 Drawing Sheets

FIG. 4.

| PVT READING | PAD LOAD CAPACITANCE (pF) | | | | | | | | |
|---|---|---|---|---|---|---|---|---|---|
| | 70-80 | 80-90 | 90-100 | 100-110 | 110-120 | 120-130 | 130-140 | 140-150 | 150-160 |
| 0000 | 7 | 7 | 7 | 7 | 7 | 7 | 7 | 7 | 7 |
| 0001 | 7 | 7 | 7 | 7 | 7 | 7 | 7 | 7 | 7 |
| 0010 | 6 | 6 | 6 | 7 | 7 | 7 | 7 | 7 | 7 |
| 0011 | 6 | 6 | 6 | 6 | 6 | 7 | 7 | 7 | 7 |
| 0100 | 5 | 5 | 5 | 6 | 6 | 6 | 6 | 7 | 7 |
| 0101 | 4 | 5 | 5 | 5 | 5 | 6 | 6 | 6 | 6 |
| 0110 | 4 | 4 | 4 | 5 | 5 | 5 | 5 | 6 | 6 |
| 0111 | 3 | 3 | 4 | 4 | 4 | 5 | 5 | 5 | 6 |
| 1000 | 2 | 3 | 3 | 4 | 4 | 4 | 5 | 5 | 5 |
| 1001 | 2 | 2 | 3 | 3 | 4 | 4 | 4 | 5 | 5 |
| 1010 | 1 | 2 | 2 | 3 | 3 | 3 | 4 | 4 | 5 |
| 1011 | 1 | 1 | 2 | 2 | 3 | 3 | 4 | 4 | 5 |
| 1100 | 0 | 1 | 1 | 2 | 2 | 3 | 3 | 4 | 4 |
| 1101 | 0 | 0 | 1 | 1 | 2 | 2 | 3 | 3 | 4 |
| 1110 | 0 | 0 | 0 | 1 | 1 | 2 | 2 | 3 | 4 |
| 1111 | 0 | 0 | 0 | 0 | 1 | 1 | 2 | 3 | 3 |

PROGRAMMABLE INTEGRATED CIRCUIT OUTPUT PAD

FIELD OF THE INVENTION

This invention relates to solid state integrated circuit chips and, more particularly, to a circuit for programmably modifying an output drive to an interconnection pad on a chip in accordance with process, voltage, temperature and output load parameters.

BACKGROUND OF THE INVENTION

A significant challenge in the design of off-chip driver circuits is to reduce the level of electromagnetic interference by preventing an output pad from being overdriven. When fast rise or fall time pulses are impressed on a chip output pad by excessive output drive levels, electromagnetic interference is radiated. Such excessive levels also create ground and power supply "bounce".

The adjustment of output pad drive current levels must take into account a number of real-world problems. Process variations experienced during chip production may result in changes in conduction channel length, carrier mobility, conduction threshold, oxide thickness, etc. Each process variation can cause a variation in a circuit's output drive. Power supply changes may alter voltage supply values by up to 20%. Temperature variations affect mobility and other semiconductor parameters. Together, process, temperature and voltage variations (hereafter referred to as "PVT") act to cause substantial variation in output rise and fall times.

Another variable parameter requiring output drive adjustment is the load capacitance connected to a chip's output pad. So long as a network interconnected with a chip pad is constant, the load capacitance seen from the pad remains constant and no adjustment is needed. However, many systems are field-configurable and enable circuit boards to be either replaced, augmented, or modified. Each of those actions results in a change in network load capacitance (as seen from a chip pad). Similarly, interconnection circuitry between a chip and the remaining network may also be subject to change, further modifying load capacitance.

Due to the fact that all of the above parameters interact to affect a chip's output electrical characteristics, circuit designers have over-designed output current drivers so that their output currents accommodated the worst case situation. Such designs resulted in excessively large output currents and excessive EMI levels. Additional packaging costs thus had to be incurred to implement added shielding and other EMI prevention techniques.

Another problem created by excessively driven rise and fall times is that signal undershoot and overshoot can result and damage connected circuit inputs, if too severe. Signal under and overshoot can also cause incorrect logic levels due to the "ringing" exceeding a logic level threshold. This ringing is referred to as ground or supply bounce.

PVT variations not only affect output drive currents but also other on-chip signal characteristics such as signal delays. Various prior art references have attempted to adjust circuit parameters in accordance with sensed PVT manifestations. One such system is described by Cox et al. in "VLSI Performance Compensation for Off-Chip Drivers and Clock Generation", IEEE 1989 Custom Integrated Circuits Conference (1989) pp. 14.3.1–14.3.4. Cox et al. employed a long string of inverters as a tapped delay line. By comparing signal propagation through the inverters against a constant frequency clock signal, chip time delays could be determined and signal propagation adjusted so as to prevent skew. Cox et al. also indicated that a number of parallel connected stages in an output driver could be modified to maintain a nearly constant output signal characteristic when "slow" circuit conditions prevailed. Conversely, the number of parallel-connected output drivers were reduced under "fast" circuit conditions to reduce output drive currents. Cox et al. did not take into account any affects resulting from changes in output load capacitance. U.S. Pat. No. 4,939,989 to Cox et al. discloses a similar system to that aforedescribed.

A variable current output driver circuit is disclosed by Kalter et al. in "A 50-ns 16-Mb DRAM with a 10-ns Data Rate and On-Chip ECC" IEEE Journal of Solid State Circuits, Vol. 25, No. 5, October 1990, pp. 1118–1127. At pages 1124–1125, Kalter et al. disclose a rate-control, off-chip driver wherein an analog potential is derived from continuously sampled output rise or fall times. The circuit requires continuous outputs to enable development of the controlling analog potential. Furthermore, the control circuit is, itself, subject to PVT variations.

Dorler et al. in U.S. Pat. No. 4,383,216 disclose an on-chip delay regulator circuit which was used to minimize chip-to-chip circuit speed differences caused by PVT variations. Changes in a periodic reference signal from a phase locked loop were employed to create an error signal which changed the applied power to the on-chip circuits. This action caused gate delays to be either increased or decreased, as necessary, to maintain a relatively constant circuit speed.

An article by Kumar in the July, 1990 issue of ASiC Technology News, pages 20–21, briefly describes a number of techniques used by designers to reduce electrical noise that occurs as a result of increased switching speeds. Kumar indicated that others have employed bi-level drivers wherein either a standard full strength drive output or a reduced drive, low noise, output is available. He indicated that the selection of drive level could be made at the time of fabrication or could be register-programmable. No indication is provided by Kumar as to a technique for enabling such drive current adjustment. Bell et al. in U.S. Pat. No. 4,494,021 employ an automatic frequency control loop wherein a voltage controlled oscillator's frequency was regulated to be equal to that of a reference frequency. The control voltage for adjusting the oscillator frequency was also employed to regulate stage-to-stage delay in the circuit.

A number of references describe the use of analog voltages to control circuit changes which occur as a result of PVT variations. See "A 300k-Circuit ASIC Logic Family" Petrovick, Jr et al 1990 IEEE International Solid-State Circuits Conference, pages 88–89, (1990); King et al., "Delay and Power Tolerance Regulator For FET Logic" IBM Technical Disclosure Bulletin, Vol. 23, No. 4, September 1980, pp. 1305–1306; Kilmer, "Process-Independent Delay Driver" IBM Technical Disclosure Bulletin, Vol. 23, No. 9, February 1981, pp. 4187–4188; and the following U.S. Pat. No. 4,473,762 to Iwahashi et al., U.S. Pat. No. 4,815,113 to Ludwig et al., U.S. Pat. No. 4,623,805 to Flora et al., U.S. Pat. No. 4,641,048 to Pollock, U.S. Pat. No.

4,684,897 to Richards et al., U.S. Pat. No. 4,691,124 to Ledzius et al., and U.S. Pat. No. 4,818,901 to Young et al.

Accordingly, it is an object of this invention to provide an adaptable output drive circuit for a chip which is responsive to both PVT parameter modifications and load capacitance changes.

It is another object of this invention to provide a programmable output drive circuit whose performance may be altered periodically during chip operation.

It is yet another object of this invention to provide a programmable output drive circuit exhibiting minimized EMI.

It is still another object of this invention to provide a programmable output drive circuit which exhibits lessened power supply "bounce" characteristics.

SUMMARY OF THE INVENTION

A system is described that includes an integrated circuit chip having output paths connected to a network whose electrical characteristics can vary. The system includes a circuit for adjusting output drive applied to a pad on the chip. The circuit includes a PVT monitor for providing an output that is related to process, voltage and temperature parameter variations on the chip. A processor (or state machine) determines network configuration information and enables the load network's electrical characteristics to be determined. The processor is responsive to an output from the PVT monitor and the load network's determined electrical characteristics to provide control outputs indicative of a required output drive level. An output drive circuit includes alterable circuitry and is responsive to the processor's control outputs to provide required output current drive levels to the pad.

DESCRIPTION OF THE DRAWINGS

FIG. 4 is a chart illustrating control outputs generated by the microprocessor of FIG. 1, in response to PVT readings and determined network electrical characteristics.

DETAILED DESCRIPTION OF THE INVENTION

Figure 1:
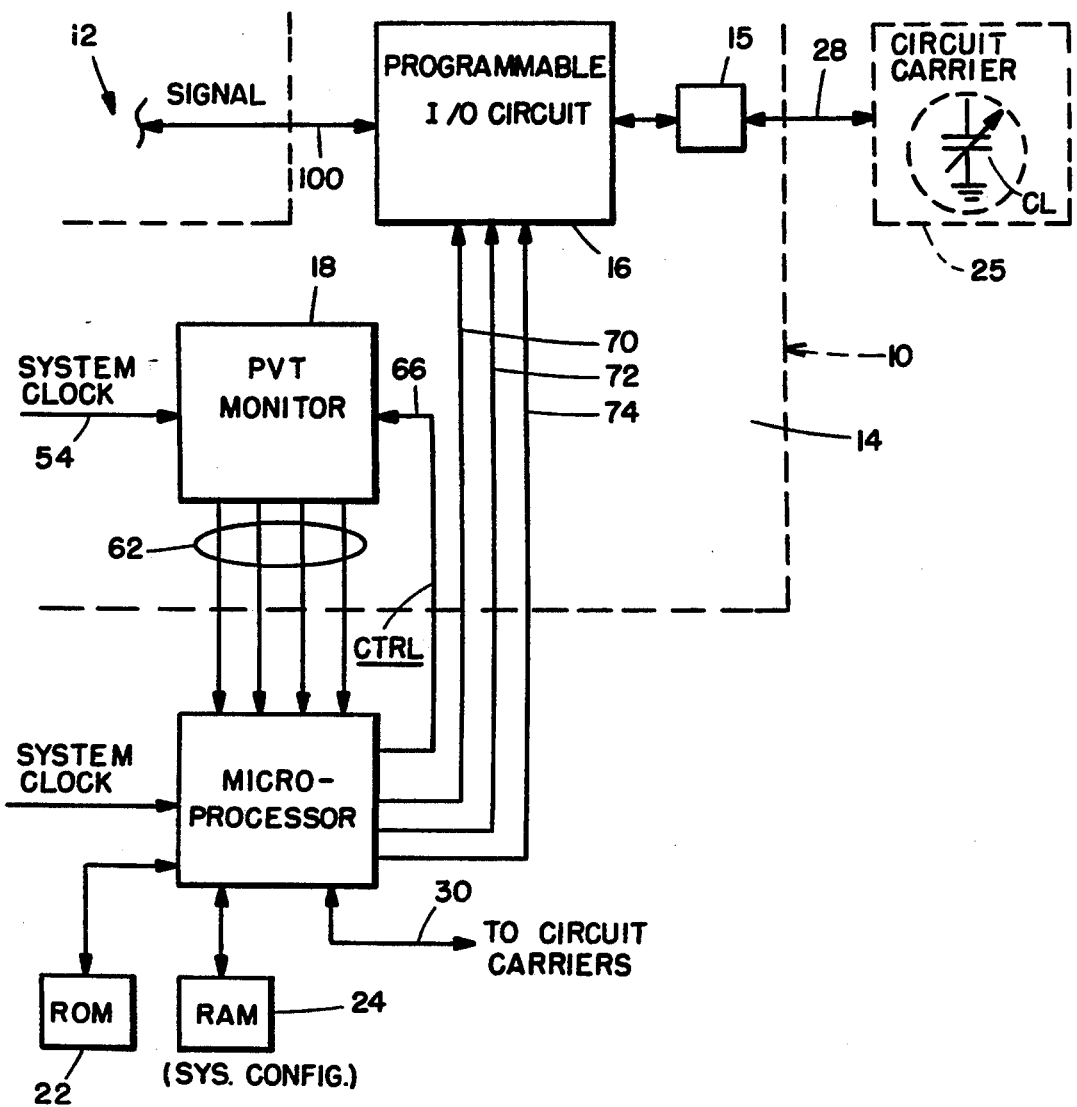
FIG. 1 is an overall block diagram illustrating the invention.

Referring to FIG. 1, a semiconductor chip 10 (shown dotted) includes a main circuit area 12 and a margin area 14. Within margin area 14, a plurality of input/output (I/O) pads 15 are positioned. Each pad 15 is connected to a programmable I/O circuit 16 which is, in turn, connected to a circuit in main circuit area 12. A PVT monitor circuit is positioned within margin area 14 and is connected to a microprocessor 20. Programmable I/O circuit 16 is also connected to microprocessor 20. Microprocessor 20 is provided with a read-only memory (ROM) 22 and a random access memory (RAM) 24. While microprocessor 20 is shown positioned off of chip 10, it could also be emplaced within main circuit area 12 of chip 10.

Chip 10 is mounted on a circuit carrier 25 and is connected thereto by a plurality of pins 28 (both schematically shown to illustrate the capacitive loading created thereby). Each pin 28 is connected through I/O pad 15 to programmable I/O circuit 16. Circuit carrier 25 may be a printed circuit board, a ceramic multi-layer circuit board, or other chip carrier. Pin 28 may also be connected to other circuit carrier connectors which may or may not be populated. Each circuit carrier 25 connected to pin 28 modifies the output impedance seen from pad 15 and, as a result, the load capacitance reflected into programmable I/O drive circuit 16.

Microprocessor 20 is provided with a bidirectional output bus 30 which is, in turn, connected to the various circuit carriers. Microprocessor 20 at power-up, surveys signals from the circuit carriers populating the system and determines the circuit carrier configuration connected to each pad 15. As an alternate, microprocessor 20 may have the system configuration pre-programmed therein. Under such circumstances microprocessor 20 would only survey signals from included circuit carriers.

Figure 2:
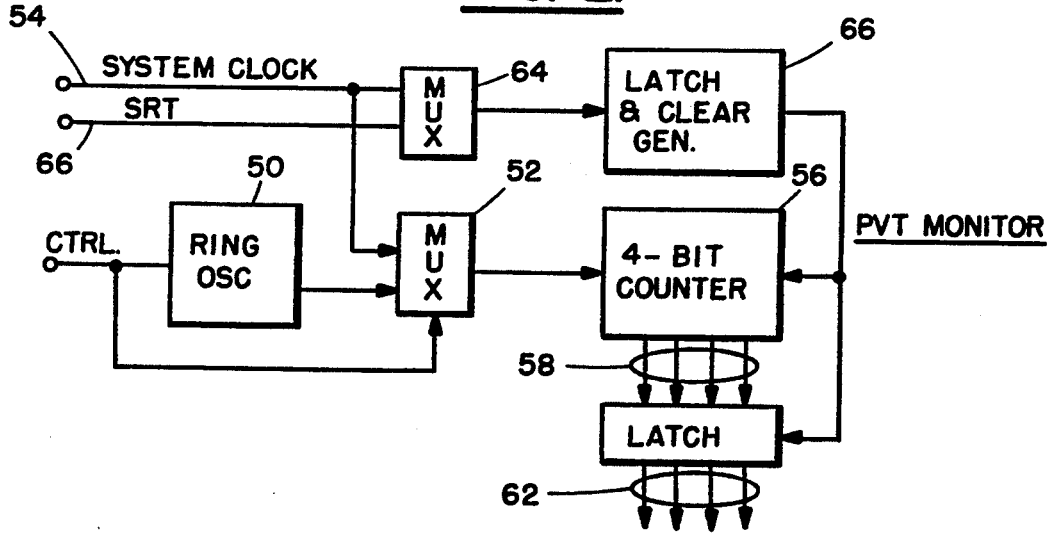
FIG. 2 is a block diagram of the PVT monitor circuit shown in FIG. 1.

ROM 22 stores a table which enables microprocessor 20 to convert the findings from the survey of circuit carriers to load capacitance values. From the derived load capacitances, microprocessor 20 then has part of the information required to enable the structuring of each programmable I/O circuit 16. The remaining portion of the information is supplied from PVT monitor 18. Details of PVT monitor 18 are shown in FIG. 2.

Ring oscillator 50 is a 13-stage, oscillator whose frequency is, to a first order, dependent upon process, supply voltage and chip temperature parameters. Oscillator 50 is preferably constructed of CMOS inverter gates. The output of ring oscillator 50 is applied to an input to a multiplexer 52. Another input to multiplexer 52 is the system clock, as received from input line 54. The output of multiplexer 52 is fed to a 4-bit counter 56 which, in turn, provides four outputs 58 indicative of its count. A four position latch 60 receives and stores, periodically, the outputs from counter 56 and manifests the stored values on output lines 62 (see also FIG. 1) to microprocessor 20. (The 4-bit size of counter 56 is merely chosen as an example and other bit lengths are equally applicable)

The system clock on input line 54 is also applied to a second multiplexer 64, along with a control SRT input 66 from microprocessor 20. The output of multiplexer 64 is applied to a latch and clear generator 66 whose outputs control 4-bit counter 56 and latch 60. Multiplexers 62, 64 and the SRT input are used for test purposes and are not directly relevant to this invention.

Ring oscillator 50 is caused to oscillate (during a time that a PVT reading is required) by a control level on input 68 from microprocessor 20. Counter 56 begins a count of the oscillations emanating from oscillator 50. At each positive-going edge of the system clock signal, latch and clear generator 66 issues a signal which causes the count present in counter 56 to be latched into latch 60 and then resets counter 56. Because the system clock is crystal controlled and invariant, its use as a reference enables the oscillator count to be an accurate representation of PVT variations.

The latched count appears on output lines 62 and provides a 4-bit indication of the number of oscillation cycles that have occurred between positive going system clock signals. That indication is representative of the combined PVT parameters present within chip 10.

Figure 3:
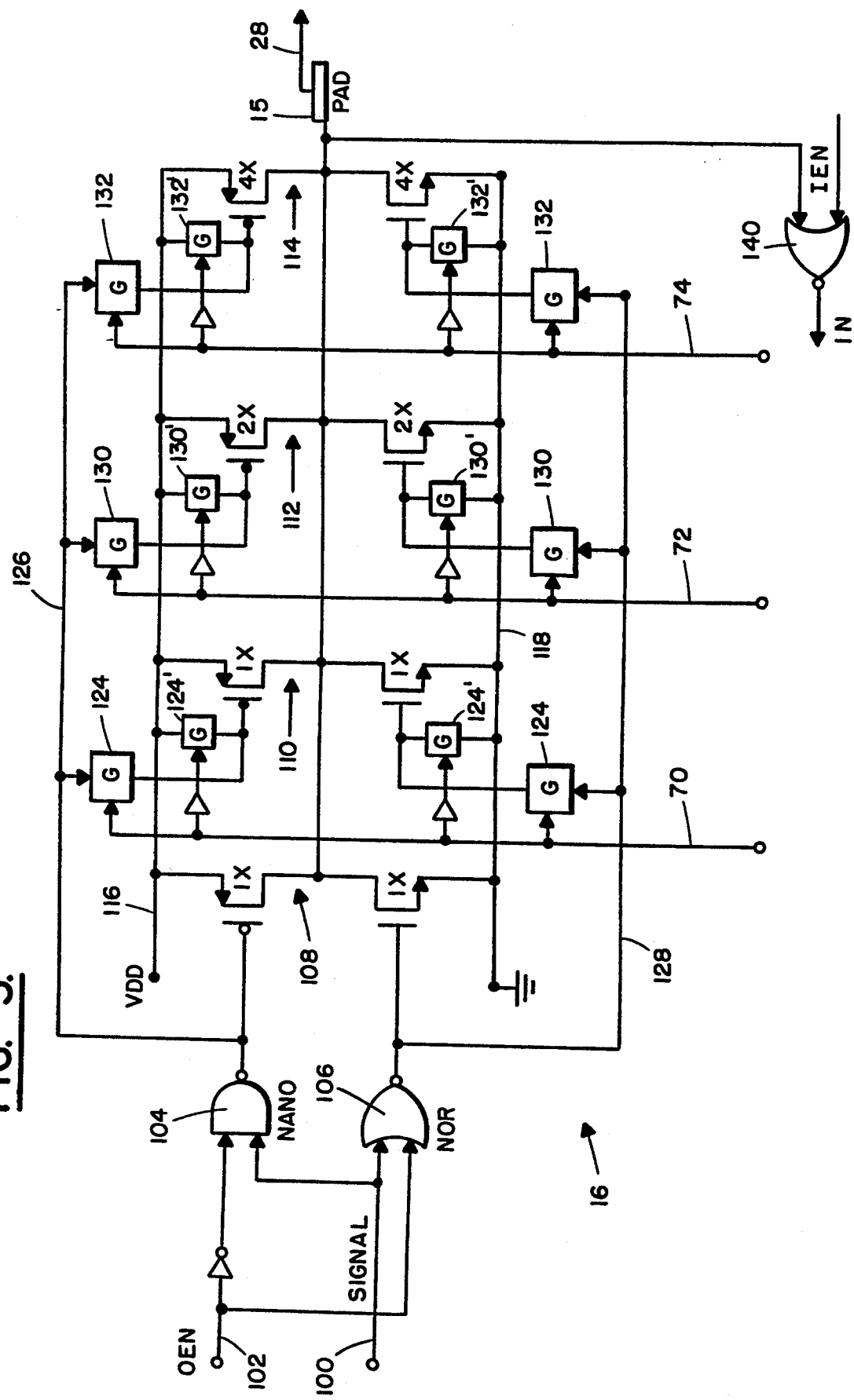
FIG. 3 is a circuit diagram of the programmable output pad circuit shown in the block diagram of FIG. 1.

Once microprocessor 20 receives a 4-bit PVT value from PVT monitor 18 and has further derived the load capacitance of the network attached to terminal 28, it is able to provide signals to programmable I/O circuit 16 which adjust the output drive strength at output pin 28. Those signals are binary and are passed via output control lines 70, 72 and 74 to programmable I/0 circuit 16. While three output control lines are shown, it is to be understood that this is merely exemplary and more control lines may be provided, one for each controllable stage within programmable I/O circuit 16. The details of programmable I/O circuit 16 are shown in FIG. 3.

A signal input 100 provides an input level from a circuit within main circuit area 12. An output enable level OEN is applied to input terminal 102 to place the circuit into an output mode. The OEN level enables NAND and NOR gates 104 and 106, respectively, to respond to input signal transitions appearing on input line 100. The OEN level enables programmable I/O circuit 16 to exhibit a tri-state output characteristic—i.e., "0", "1" or high impedance If the high impedance output is not required, the circuit can be configured to just produce "0" or "1" levels.

A plurality of inverter output stages 108, 110, 112 and 114 are connected, in parallel, between a VDD bus 116 and a ground bus 118. Each inverter stage is comprised of a pair of complementary field effect transistors, connected source to drain and between VDD bus 116 and ground bus 118. An output line 120 interconnects each inverter's common source/drain interconnection to output pad 15. Output pad 15 is in turn connected to output pin 28, and from there to the circuit carrier network.

Inverter 108 is not programmable and is always connected to output signal busses 126 and 128, (which, in turn, manifest the outputs from NAND and NOR gates 104 and 106, respectively). Inverters 110, 112 and 114 are programmable via the action of transmission gates 124, 130 and 132, respectively. More specifically, the gates of the upper and lower transistors in inverter 110 are connected through transmission gates 124, to output signal busses 126 and 128 respectively. In a similar manner, transmission gates 130 and 132 interconnect the gates of the upper and lower transistors of inverters 112 and 114 to output signal buses 126 and 128. The controlling inputs for transmission gates 124, 130 and 132 are respectively derived from control inputs 70, 72 and 74 from microprocessor 20. Depending upon the logical levels applied to control inputs 70, 72 and 74, inverters 110, 112 and 114 will either be connected to or disconnected from output signal buses 126, 128.

Additional transmission gates 124, ' 130' and 132' connect the gates of the transistors in inverters 110, 112 and 114 to VDD and ground lines 116 and 128, respectively. Each of gates 124', 130' and 132' is fed through an inverter and evidences a complementary state to transmission gates 124, 130 and 132 respectively. Transmission gates 124', 130' and 132' when conductive, assure that the gates of the inverter transistors do not float and are tied to a supply bus.

Control inputs 70, 72 and 74, together, manifest a 3-bit binary word whose value can range from 0 to 7 depending upon the applied levels. As a result, there are eight distinct combinations of connected/disconnected inverter stages 110, 112 and 114 which may be connected between output signal buses 126 and 128. Inverter 108, as aforestated, is always connected between output buses 126 and 128 and provides a default drive current for output line 120.

Each inverter stage can impress upon output line 120; a high voltage value (VDD); a low voltage (ground); or a high impedance interface when both transistors are nonconductive. When OEN line 102 is active low and signal line 100 is active high, NAND gate 104 and NOR gate 106 will provide complementary output values to drive the transistors of a connected inverter. When OEN line 102 is active low, outputs from NAND gate 104 and NOR gate 106 render connected inverter transistors into a nonconductive state.

To provide a further level of output drive current control, the transistors in inverters 110, 112 and 114 are sized to provide a binary progression of drive capability. Thus, the transistors in inverter 114 are designed to have a conduction channel which is four times larger than the transistors in inverter 110, and the transistors in inverter 112 are sized to have a conduction channel twice as large as the the transistors in inverter 110. Those skilled in the art will realize that the combination of binary sized conduction channels with binary control inputs provides a linear output progression of output drives on output line 120 with a progression of count values on control inputs 70, 72 and 74.

Programmable I/O circuit 16 also includes an input function which is enabled by an IEN level applied to NOR circuit 140. The input circuit is not programmable and is not an important feature of this invention.

Referring now to FIG. 4, a table (exemplary) is shown that is stored in ROM 22 (or in RAM 24) and provides digital values for control inputs 70, 72 and 74 of programmable I/O circuit 16. It will be noted that, in this example, PVT readings vary from 0000 to 1111, with the lower binary values indicating a "slow" oscillator frequency and the higher binary values indicating a "fast" oscillator frequency. A slow oscillator frequency is indicative of one or more of the following: a high temperature leading to reduced transconductances; a low voltage from the VDD supply; a process variation that causes electron mobilities to be affected, etc. A fast oscillator frequency indicates the opposite.

The horizontal axis of the table in FIG. 4 indicates pad load capacitances that are determined by microprocessor 20 in response to its survey of circuit carriers connected to output pin 28. Thus, certain combinations of circuit carriers will result in a large output capacitance, whereas other configurations will result in lower output capacitances. The table shown in FIG. 4 may be interpreted as follows. For a fast oscillator value (1111) and a low output load capacitance (e.g.. 70–80 pF), the table cause O's to be output on control lines 70, 72 and 74 (e.g. low logical levels). The low levels on output lines 70, 72 and 74 cause switches 124, 130 and 132, respectively, to be in their nonconductive states. However, since inverter 108 is always connected to output signal buses 126 and 128, a minimum output drive current is provided to output pad 15.

If a fast oscillator value (1111) is indicated by PVT monitor 18, and a maximum load capacitance (150–160 pF) has been determined by microprocessor 20, then a digital values equal to 3 (011) is impressed on control lines 70, 72 and 74. This results in high logic levels being applied to output control lines 70 and 72 while a low level is applied to control line 74. As a result, inverter stages 108, 110 and 112 combine their output drives onto output line 120.

Finally, if a low PVT reading value emanates from PVT monitor 18 and a high load capacitance is found by microprocessor 20, then a value of 7 (111) is output from the table in FIG. 4 and high levels are applied to each of output control lines 70, 72 and 74. This results in all four of inverters 108, 110, 112 and 114 being operational.

The provision of different drive capacity transistors in inverters 110, 112 and 114 results in a reduction in "ground" bounce when large output currents are driven onto output conductor 120. Ground or supply bounce is an overshoot or ringing that occurs when fast rise or fall, large outputs are emplaced upon output conductor 120. Ground or supply bounce is related to the rate of change of gate signals to inverters 108, 110, 112 and 114. This effect is reduced in the circuit shown in FIG. 3 due to the fact that the gate capacitances of the transistors in inverters 110, 112 and 114 are increasingly larger with conduction channel size. Thus, when all inverters are gated on, the transistors in inverter 110 will be rendered conductive shortly before the transistors in inverter 112. In the same manner, transistors in inverter 112 will become conductive shortly before the transistors in inverter 114, all because of the different gate capacitance charge times through gates 124, 130 and 132 (all of which exhibit the same resistance). This effect will affect the signal rise time and reduce resulting ground bounce.

From the above, it can be seen that the output drive for any pad can be modified in accordance with PVT and load capacitance values determined at any time during the operation of a system. Simply by reverting to a programing subcycle, microprocessor 20 can readjust each programmable I/O circuit in accordance with the then extant parameters.

It should be understood that the foregoing description is only illustrative of the invention.

Various alternatives and modifications can be devised by those skilled in the art without departing from the invention. For instance, while the circuit diagram of FIG. 4 is configured with FET devices, it could also be configured with bipolar transistors. Accordingly, the present invention is intended to embrace all such alternatives, modifications and variances which fall within the scope of the appended claims.

We claim:

1. A system including an integrated circuit chip having output pads connected to a network whose electrical characteristics can vary, the system including means for adjusting output drive currents applied to a pad, said means comprising:

PVT monitor means for providing an output that is related to process, voltage and temperature parameter variations on said chip;

logic means for determining network configuration information that enables a network's capacitance characteristics to be determined, said logic means responsive to an output from said PVT monitor means and a determined network capacitance characteristic to provide control outputs indicative of a required output drive current; and drive means, including alterable circuitry, responsive to said control outputs to modify said alterable circuitry to provide said required output drive current.

2. The system as recited in claim 1, wherein said PVT monitor means comprises:

an oscillator whose frequency of oscillation is dependent upon process, voltage and temperature parameters;

clock frequency means for providing a clock signal; and register means for manifesting a number output indicative of a relationship between said clock signal and said frequency of oscillation.

3. The system as recited in claim 1, wherein said logic means determines said system configuration by interrogating said system to determine what network components are interconnected with said pad.

4. The system as recited in claim 1, wherein said logic means includes a microprocessor.

5. The system as recited in claim 1, wherein said logic means includes a state machine.

6. The system as recited in claim 1, wherein said logic means stores a table that provides a network capacitance characteristic indication in response to a determination of said system configuration information.

7. The system as recited in claim 6, wherein said logic means stores a further table that interrelates outputs from said PVT monitor means and said network capacitance characteristic and manifests required control outputs in accordance with said interrelation.

8. The system as recited in claim 1, wherein said drive means comprises a plurality of shunt connected inverters coupled to said pad, a subset of said inverters also coupled to said control outputs from said logic means, each inverter in said subset responsive to a first logic level on a control output from said logic means to respond to an input signal by impressing an output drive current on said pad.

9. The system as recited in claim 8, wherein said logic means provide N control output values, each said value manifesting first and second logic levels; said subset of inverters including N inverters, each said inverter responsive to a first logic value to be responsive to said input signal.

10. The system as recited in claim 9, wherein each said inverter in said subset manifests a different capacitance, whereby an applied input signal results in a said inverter in said subset becoming conductive at a different rate from another inverter in said subset.

11. The system as recited in claim 9, wherein each of said N inverters includes transistors, the transistors in each said inverter exhibiting a different size, said sizes varying in accordance with an increasing binary value.

12. The system as recited in claim 11, wherein each said inverter comprises a pair of series connected complementary transistors, with said pad connected to said series connection of each said pair of transistors, controlling electrodes of each said pair of transistors in said subset of inverter coupled to gate means, each said gate means, in turn, coupled to a control output from said processor means and a signal input line.

13. The system as recited in claim 9, wherein each of said N inverters includes FET's, the FET's in each said inverter exhibiting a different conduction channel size, said sizes varying in accordance with an increasing binary value.

14. The system as recited in claim 13, wherein each said inverter of said subset comprises a pair of complementary FET's, series connected, with said pad connected to said series connection of each said pair of FET's, gates of each said pair of FET's coupled to first gate means, each said gate means, in turn, coupled to a control output from said processor means and a signal input line.

15. The system as recited in claim 14 wherein each inverter of said subset includes second gate means coupled the gates of each said pair of FET's, said second gate means coupled to supply lines and conductive when said first gate means are nonconductive and visa versa.

* * * * *